(12) United States Patent
Toda

(10) Patent No.: US 6,259,245 B1
(45) Date of Patent: Jul. 10, 2001

(54) ELECTRIC-CURRENT SENSING DEVICE

(76) Inventor: Kohji Toda, 1-49-18 Futaba, Yokosuka, 239-0814 (JP)

( * ) Notice: Subject to any disclaimer, the term of this patent is extended or adjusted under 35 U.S.C. 154(b) by 0 days.

(21) Appl. No.: 09/472,742

(22) Filed: Dec. 27, 1999

(51) Int. Cl.[7] .................................................. G01R 19/00
(52) U.S. Cl. ...................... 324/117 R; 324/244; 324/96; 324/207.13; 250/227.18
(58) Field of Search ............................ 324/117 R, 117 H, 324/96, 126, 109, 244, 260, 207.13, 127; 385/12, 11, 15; 250/227, 227.18, 17

(56) References Cited

U.S. PATENT DOCUMENTS

| | | | |
|---|---|---|---|
| 4,121,155 | * 10/1978 | Chamuel | 324/207 |
| 4,563,639 | * 1/1986 | Langeac | 324/96 |
| 5,051,577 | * 9/1991 | Lutz et al. | 324/96 |
| 5,365,175 | * 11/1994 | Patterson et al. | 324/501 |

FOREIGN PATENT DOCUMENTS

2134270  * 8/1984  (GB)  ............................ G01R/19/00

* cited by examiner

*Primary Examiner*—Safet Metjahic
*Assistant Examiner*—Jimmy Nguyen

(57) ABSTRACT

An electric-current sensing device comprises an input ultrasonic transducer assembly, an output ultrasonic transducer assembly and an ultrasonic fiber between the two assembly. The input ultrasonic transducer assembly consists of an input piezoelectric vibrator, a driving electrode, an input ground electrode and an input vibrating plate. The output ultrasonic transducer assembly consists of an output piezoelectric vibrator, a detecting electrode, an output ground electrode and an output vibrating plate. When an input electric signal is applied to the input piezoelectric vibrator through the driving electrode and the input ground electrode, the input piezoelectric vibrator is acoustically vibrated. An acoustic vibration in the input piezoelectric vibrator is transmitted to the output piezoelectric vibrator, and detected between the detecting electrode and the output ground electrode, as a delayed electric signal. If the ultrasonic fiber is left in a magnetic field, the delayed electric signal is changed in accordance with an intensity in magnetic field. Therefore, an electric current around the ultrasonic fiber can be sensed from the delayed electric signal.

20 Claims, 15 Drawing Sheets

23 self-oscillator circuit 24 frequency counter signal analyzing unit signal analyzing unit

ELECTRIC-CURRENT SENSING DEVICE

BACKGROUND OF THE INVENTION

1. Field of the Invention

The present invention relates to a device for sensing an electric current by measuring an intensity in magnetic field around an ultrasonic fiber constructed in the device.

2. Description of the Prior Art

Conventional devices for measuring magnetic field intensity include a semiconductor-type device, which makes use of the Hall effect or magnet resistance effect in a semiconductor. The semiconductor-type device is of practical use, however, has a problem that a dynamic range for measurement is limited. Recently, a device using an optical-fiber cable is proposed for measuring magnetic field intensity caused by an electric current flowing in an electric wire. The optical-fiber type of device makes use of a delay-time change accompanying with an intensity change in magnetic field, and has a problem of the difficulty in substantially shortening the optical-fiber cable.

SUMMARY OF THE INVENTION

An object of the present invention is to provide an electric-current sensing device capable of measuring magnetic field intensity and sensing an electric current flowing in, for example, an electric wire, without disturbing a flow of the electric current and nondestructively.

Another object of the present invention is to provide an electric-current sensing device capable of making a dynamic range for measurement widely.

Another object of the present invention is to provide an electric-current sensing device capable of a quick response with a high sensitivity.

Another object of the present invention is to provide an electric-current sensing device capable of decreasing an electric power consumption.

A still other object of the present invention is to provide an electric-current sensing device easy in use and having a small size which is very light in weight and has a simple structure.

According to one aspect of the present invention there is provided an electric-current sensing device comprising an input ultrasonic transducer assembly, an output ultrasonic transducer assembly and an ultrasonic fiber made of a magneto-strictive delay line. The input ultrasonic transducer assembly consists of an input piezoelectric vibrator having two end surfaces perpendicular to the thickness direction thereof, a driving electrode formed on one end surface of the input piezoelectric vibrator, an input ground electrode formed on the other end surface of the input piezoelectric vibrator, and an input vibrating plate cemented to the input piezoelectric vibrator through the input ground electrode. The output ultrasonic transducer assembly consists of an output piezoelectric vibrator having two end surfaces perpendicular to the thickness direction thereof, a detecting electrode formed on one end surface of the output piezoelectric vibrator, an output ground electrode formed on the other end surface of the output piezoelectric vibrator, and an output vibrating plate cemented to the output piezoelectric vibrator through the output ground electrode. The ultrasonic fiber is connected between the input vibrating plate and the output vibrating plate.

When an input electric signal is applied to the input piezoelectric vibrator through the driving electrode and the input ground electrode, the input piezoelectric vibrator is acoustically vibrated. An acoustic vibration in the input piezoelectric vibrator is transmitted to the input vibrating plate, and then, to the output vibrating plate through the ultrasonic fiber. The acoustic vibration in the output vibrating plate is transmitted to the output piezoelectric vibrator, and detected between the detecting electrode and the output ground electrode, as a delayed electric signal. If the ultrasonic fiber is left in a magnetic field, the delayed electric signal is changed in accordance with an intensity in magnetic field. Therefore, an electric current around the ultrasonic fiber can be sensed from the delayed electric signal.

According to another aspect of the present invention there is provided an ultrasonic fiber having a coil-shaped structure.

According to another aspect of the present invention there is provided an input- and output piezoelectric vibrators made of a piezoelectric ceramic, respectively, of which the polarization axis is parallel to the thickness direction thereof.

According to another aspect of the present invention there is provided an input- and output piezoelectric vibrators having a square pillar- or a cylindrical-shaped body with the same shaped pierced hall parallel to the thickness direction thereof. In addition it is better that the shortest distance between an outer- and an inner edges on an end surface of the body is approximately equal to the thickness thereof. When the input- and output piezoelectric vibrators have such a construction, the input vibrating plate is cemented to the input piezoelectric vibrator such that the input vibrating plate covers an opening of the pierced hall of the input piezoelectric vibrator, and the output vibrating plate is cemented to the output piezoelectric vibrator such that the output vibrating plate covers an opening of the pierced hall of the output piezoelectric vibrator.

According to another aspect of the present invention there is provided an input- and output piezoelectric vibrators having an approximately square plate- or an approximately square pillar-shaped body. In this time, the input vibrating plate is cemented to the input piezoelectric vibrator such that the input vibrating plate projects like a springboard, and the output vibrating plate is cemented to the output piezoelectric vibrator such that the output vibrating plate projects like a springboard.

According to another aspect of the present invention there is provided a signal analyzing unit consisting of an amplifier and a frequency counter. The amplifier amplifies the delayed electric signal and supplies the driving electrode and the input ground electrode with a part of an amplified electric signal. Thus, the input piezoelectric vibrator, the input vibrating plate, the ultrasonic fiber, the output vibrating plate, the output piezoelectric vibrator and the amplifier form a delay-line oscillator. The frequency counter receives a remaining part of the amplified electric signal and senses the electric current around the ultrasonic fiber in terms of a frequency of the amplified electric signal.

According to another aspect of the present invention there is provided a signal analyzing unit consisting of an amplifier and a frequency to voltage converter. The amplifier amplifies the delayed electric signal and supplies the driving electrode and the input ground electrode with a part of an amplified electric signal. Thus, the input piezoelectric vibrator, the input vibrating plate, the ultrasonic fiber, the output vibrating plate, the output piezoelectric vibrator and the amplifier form a delay-line oscillator. The frequency to voltage converter receives a remaining part of the amplified electric signal and senses the electric current around the ultrasonic fiber in terms of a voltage of a converted electric signal.

According to another aspect of the present invention there is provided a signal analyzing unit consisting of a signal generator and a phase comparator. The signal generator generates the input electric signal. The phase comparator senses the electric current around the ultrasonic fiber in terms of a phase difference between a phase of the input electric signal and that of the delayed electric signal.

According to other aspect of the present invention there is provided a feedback electrode formed on the one end surface of the input piezoelectric vibrator such that the driving electrode and the feedback electrode are electrically separated, and that an area of the feedback electrode on the one end surface is less than that of the driving electrode thereon. The feedback electrode and the input ground electrode transduce the acoustic vibration between the feedback electrode and the input ground electrode to an electric signal, and supplies the driving electrode and the input ground electrode with a transduced electric signal again.

According to a further aspect of the present invention there is provided an electric-current sensing device comprising a measurement input ultrasonic transducer assembly, a measurement output ultrasonic transducer assembly, a measurement ultrasonic fiber made of a magneto-strictive delay line, a reference input ultrasonic transducer assembly, a reference output ultrasonic transducer assembly, a reference ultrasonic fiber made of a magneto-strictive delay line, and a signal analyzing unit. The measurement input ultrasonic transducer assembly consists of a measurement input piezoelectric vibrator having two end surfaces perpendicular to the thickness direction thereof, a measurement driving electrode formed on one end surface of the measurement input piezoelectric vibrator, a measurement input ground electrode formed on the other end surface of the measurement input piezoelectric vibrator, and a measurement input vibrating plate cemented to the measurement input piezoelectric vibrator through the measurement input ground electrode. The measurement output ultrasonic transducer assembly consists of a measurement output piezoelectric vibrator having two end surfaces perpendicular to the thickness direction thereof, a measurement detecting electrode formed on one end surface of the measurement output piezoelectric vibrator, a measurement output ground electrode formed on the other end surface of the measurement output piezoelectric vibrator, and a measurement output vibrating plate cemented to the measurement output piezoelectric vibrator through the measurement output ground electrode. The measurement ultrasonic fiber is connected between the measurement input vibrating plate and the measurement output vibrating plate. The reference input ultrasonic transducer assembly consists of a reference input piezoelectric vibrator having two end surfaces perpendicular to the thickness direction thereof, a reference driving electrode formed on one end surface of the reference input piezoelectric vibrator, a reference input ground electrode formed on the other end surface of the reference input piezoelectric vibrator, and a reference input vibrating plate cemented to the reference input piezoelectric vibrator through the reference input ground electrode. The reference output ultrasonic transducer assembly consists of a reference output piezoelectric vibrator having two end surfaces perpendicular to the thickness direction thereof, a reference detecting electrode formed on one end surface of the reference output piezoelectric vibrator, a reference output ground electrode formed on the other end surface of the reference output piezoelectric vibrator, and a reference output vibrating plate cemented to the reference output piezoelectric vibrator through the reference output ground electrode. The reference ultrasonic fiber is connected between the reference input vibrating plate and the reference output vibrating plate, and kept out of the influence of the magnetic field.

When an input electric signal is applied to the reference input piezoelectric vibrator through the reference driving electrode and the reference input ground electrode, the reference input piezoelectric vibrator is acoustically vibrated. An acoustic vibration in the reference input piezoelectric vibrator is transmitted to the reference output piezoelectric vibrator, and detected between the reference detecting electrode and the reference output ground electrode, as a reference delayed electric signal. In the same way, when an input electric signal is applied to the measurement input piezoelectric vibrator through the measurement driving electrode and the measurement input ground electrode, the measurement input piezoelectric vibrator is acoustically vibrated. An acoustic vibration in the measurement input piezoelectric vibrator is transmitted to the measurement output piezoelectric vibrator, and detected between the measurement detecting electrode and the measurement output ground electrode, as a measurement delayed electric signal. If the measurement ultrasonic fiber is left in a magnetic field, the measurement delayed electric signal is changed in accordance with an intensity in magnetic field. Thus, the signal analyzing unit senses an electric current around the measurement ultrasonic fiber from a difference between the reference delayed electric signal and the measurement delayed electric signal.

BRIEF DESCRIPTION OF THE DRAWINGS

Other features and advantages of the invention will be clarified from the following description with reference to the attached drawings.

DETAILED DESCRIPTION OF THE PRESENTLY PREFERRED EXEMPLARY EMBODIMENTS

Figure 1:
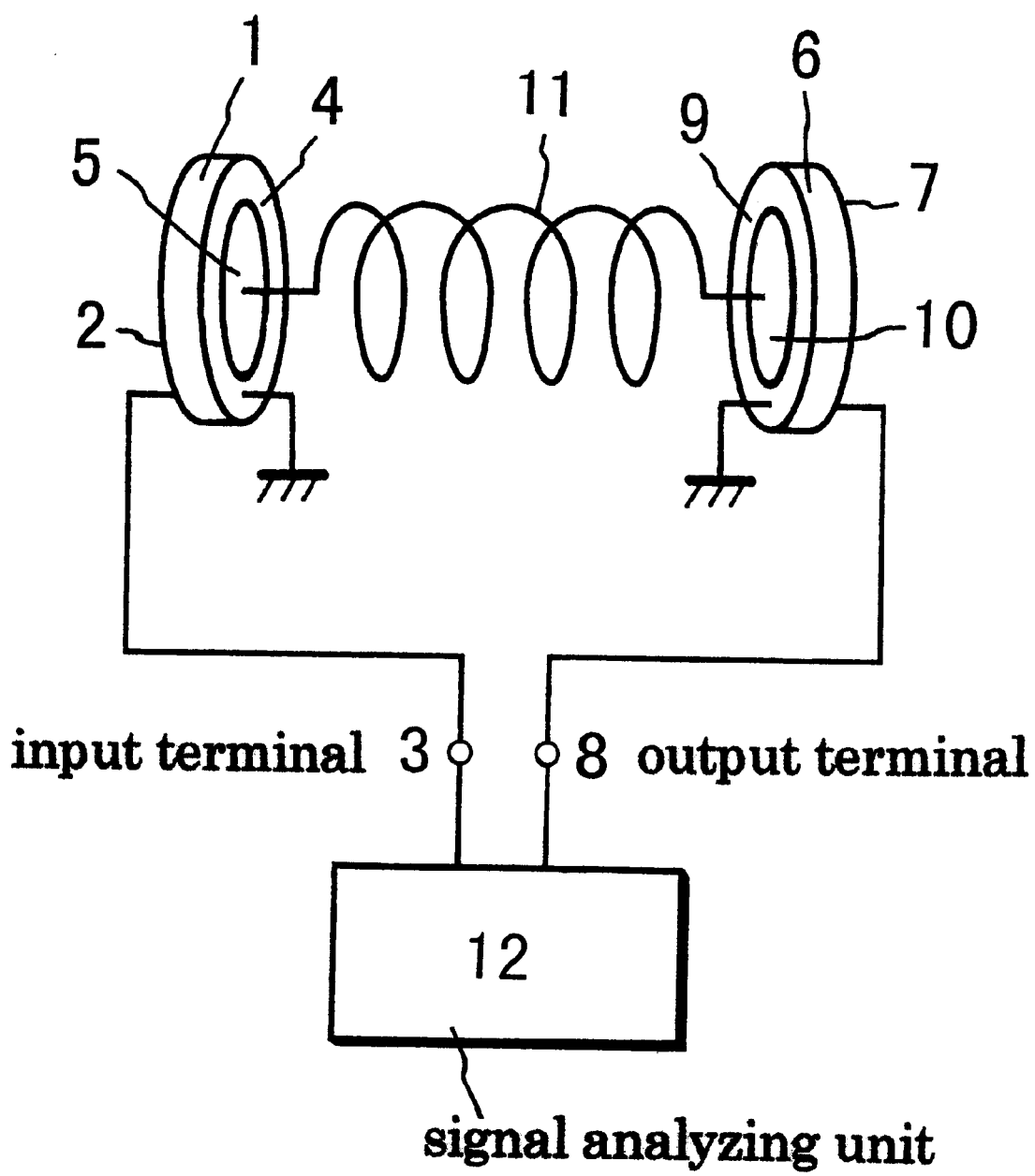
FIG. 1 shows a schematic illustration of an electric-current sensing device according to a first embodiment of the present invention.

FIG. 1 shows a schematic illustration of an electric-current sensing device according to a first embodiment of the present invention. The electric-current sensing device comprises input piezoelectric vibrator 1, driving electrode 2 having input terminal 3, input ground electrode 4, input vibrating plate 5, output piezoelectric vibrator 6, detecting electrode 7 having output terminal 8, output ground electrode 9, output vibrating plate 10 and ultrasonic fiber 11 connected between input vibrating plate 5 and output vibrating plate 10. The electric-current sensing device further comprises signal analyzing unit 12. Input piezoelectric vibrator 1, driving electrode 2, input ground electrode 4 and input vibrating plate 5 form an input ultrasonic transducer assembly. Output piezoelectric vibrator 6, detecting electrode 7, output ground electrode 9 and output vibrating plate 10 form an output ultrasonic transducer assembly. Ultrasonic fiber 11 is made of a magneto-strictive delay line having a coil-shaped structure with dimensions of 0.2 mm in diameter and 20 cm in length.

Figure 2:
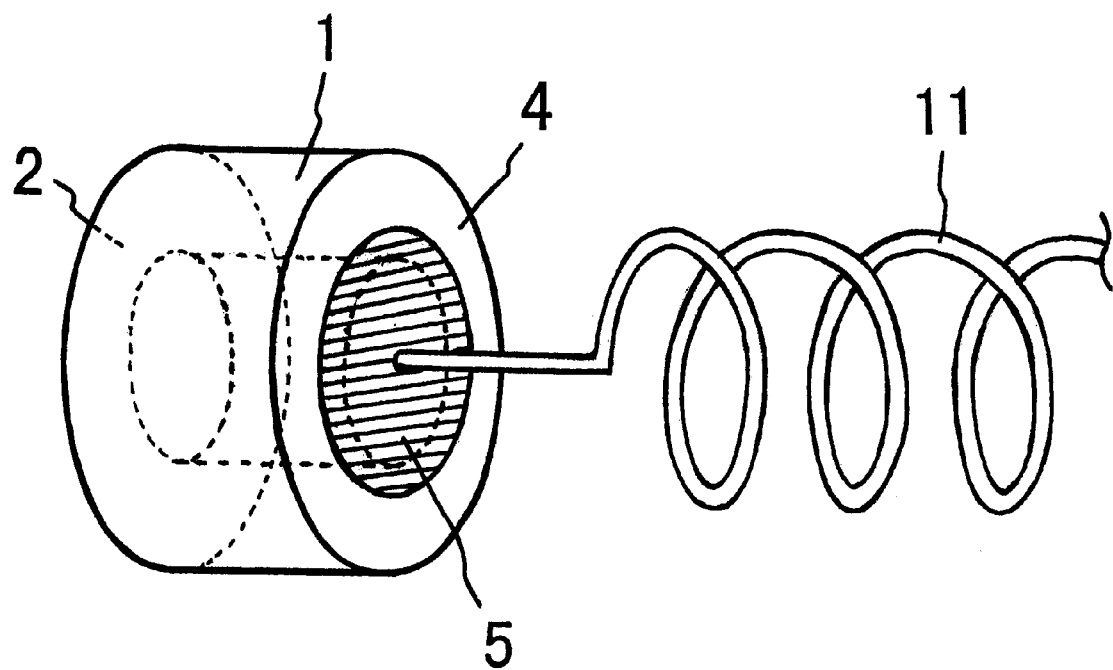
FIG. 2 shows a perspective view of the input ultrasonic transducer assembly in FIG. 1.

FIG. 2 shows a perspective view of the input ultrasonic transducer assembly in FIG. 1. Ultrasonic fiber 11 is also shown in FIG. 2. Input piezoelectric vibrator 1, made of a piezoelectric ceramic, has a cylindrical-shaped body with the same shaped pierced hall parallel to the thickness direction thereof. The direction of the polarization axis of input piezoelectric vibrator 1 is parallel to the thickness direction thereof. Input piezoelectric vibrator 1 has dimensions of 2.5 mm in thickness, 4.5 mm in inner diameter and 8.5 mm in outer diameter on an end surface thereof. Drive electrode 2 and input ground electrode 4, made of an aluminum thin film, are formed on two end surfaces of input piezoelectric vibrator 1, respectively. Input vibrating plate 5 is made of stainless steel and has a disk-shaped body with dimensions of 5.5 mm in diameter and 50 $\mu$m in thickness. An end surface of input vibrating plate 5 consists of a first surface portion with a ring shape and a second surface portion surrounded by the first surface portion. The first surface portion is cemented to input ground electrode 4 such that an opening of the pierced hall is covered with input vibrating plate 5. A tip of ultrasonic fiber 11 is cemented to the center of the second surface portion. The output ultrasonic transducer assembly has the same construction as the input ultrasonic transducer assembly. Thus, output piezoelectric vibrator 6 has a cylindrical-shaped body with the same shaped pierced hall parallel to the thickness direction thereof. Detection electrode 7 and output ground electrode 9 are formed on two end surfaces of output piezoelectric vibrator 6, respectively. Output vibrating plate 10 is cemented to output piezoelectric vibrator 6 through output ground electrode 9.

Figure 3:
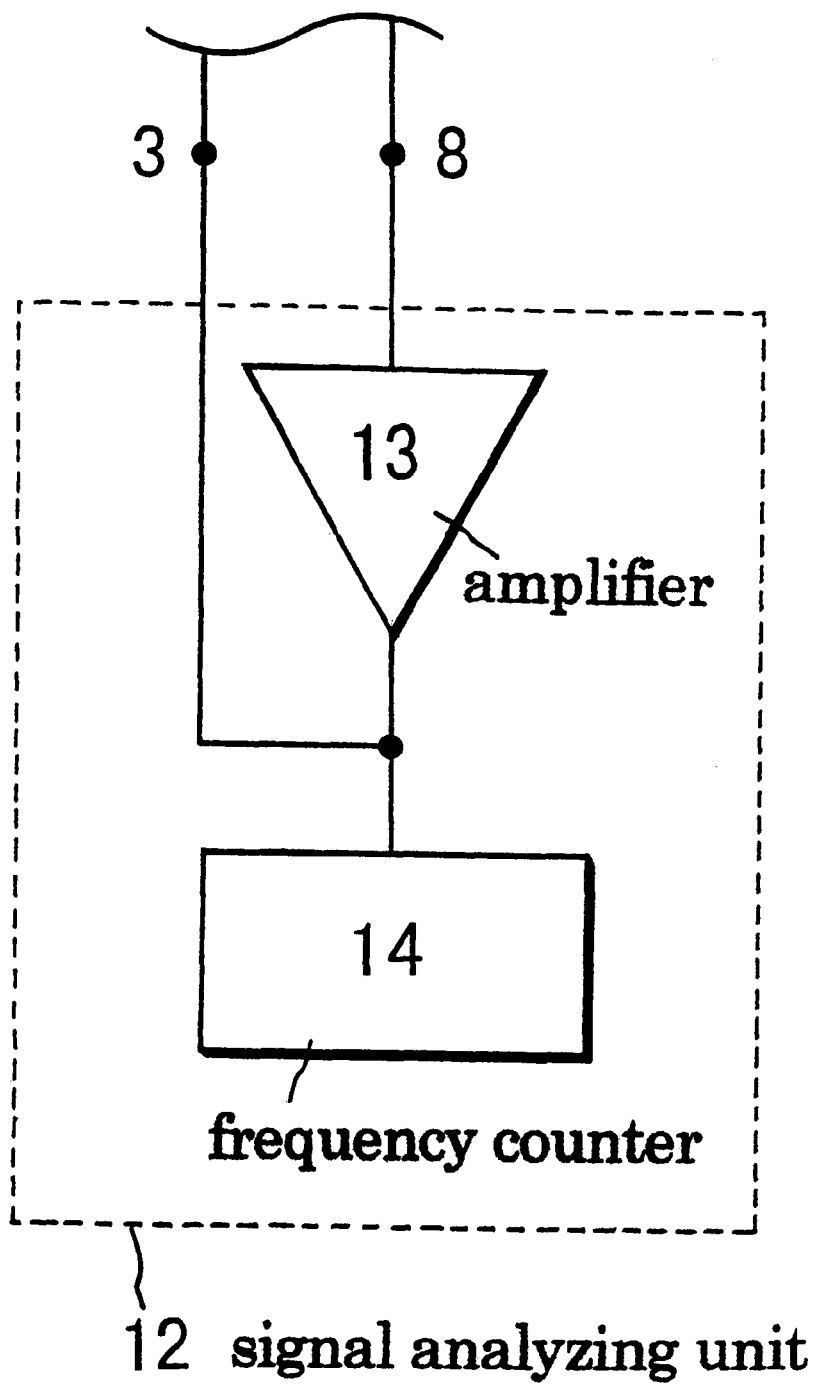
FIG. 3 shows a diagram of signal analyzing unit 12 according to a first embodiment.

FIG. 3 shows a diagram of signal analyzing unit 12 according to a first embodiment. Signal analyzing unit 12 comprises amplifier 13 and frequency counter 14.

In the electric-current sensing device in FIG. 1 having signal analyzing unit 12 in FIG. 3, if an input electric signal with a frequency approximately equal to a resonance frequency of input piezoelectric vibrator 1 is applied to input piezoelectric vibrator 1 through driving electrode 2 and input ground electrode 4, input piezoelectric vibrator 1 is acoustically vibrated. Because input piezoelectric vibrator 1 is made of a piezoelectric ceramic, and in addition, the polarization axis thereof is parallel to the thickness direction thereof, an acoustic vibration occurs in input piezoelectric vibrator 1 effectively. Since the opening of input piezoelectric vibrator 1 is covered with input vibrating plate 5, which looks like an extended leather in a drum, the acoustic vibration is effectively transmitted to input vibrating plate 5. Then, the acoustic vibration is transmitted to output vibrating plate 10 through ultrasonic fiber 11. In other words, a large vibration displacement occurs in ultrasonic fiber 11. The acoustic vibration in output vibrating plate 10 is transmitted to output piezoelectric vibrator 6, and then detected between detecting electrode 7 and output ground electrode 9, as a delayed electric signal. The delayed electric signal is amplified via amplifier 13. A part of an amplified electric signal is applied to input piezoelectric vibrator 1 through driving electrode 2 and input ground electrode 4 again. Thus, input piezoelectric vibrator 1, input vibrating plate 5, ultrasonic fiber 11, output vibrating plate 10, output piezoelectric vibrator 6 and amplifier 13 form a self-oscillation type of delay-line oscillator. On the other hand, a remaining part of the amplified electric signal is transmitted to frequency counter 14. If ultrasonic fiber 11 is left in a magnetic field, a frequency of the amplified electric signal is changed in accordance with an intensity in magnetic field. Therefore, an electric current around ultrasonic fiber 11 can be sensed in terms of the frequency of the amplified electric signal. Thus, for example, an electric-current leakage out of an electric wire is sensed.

Figure 4:
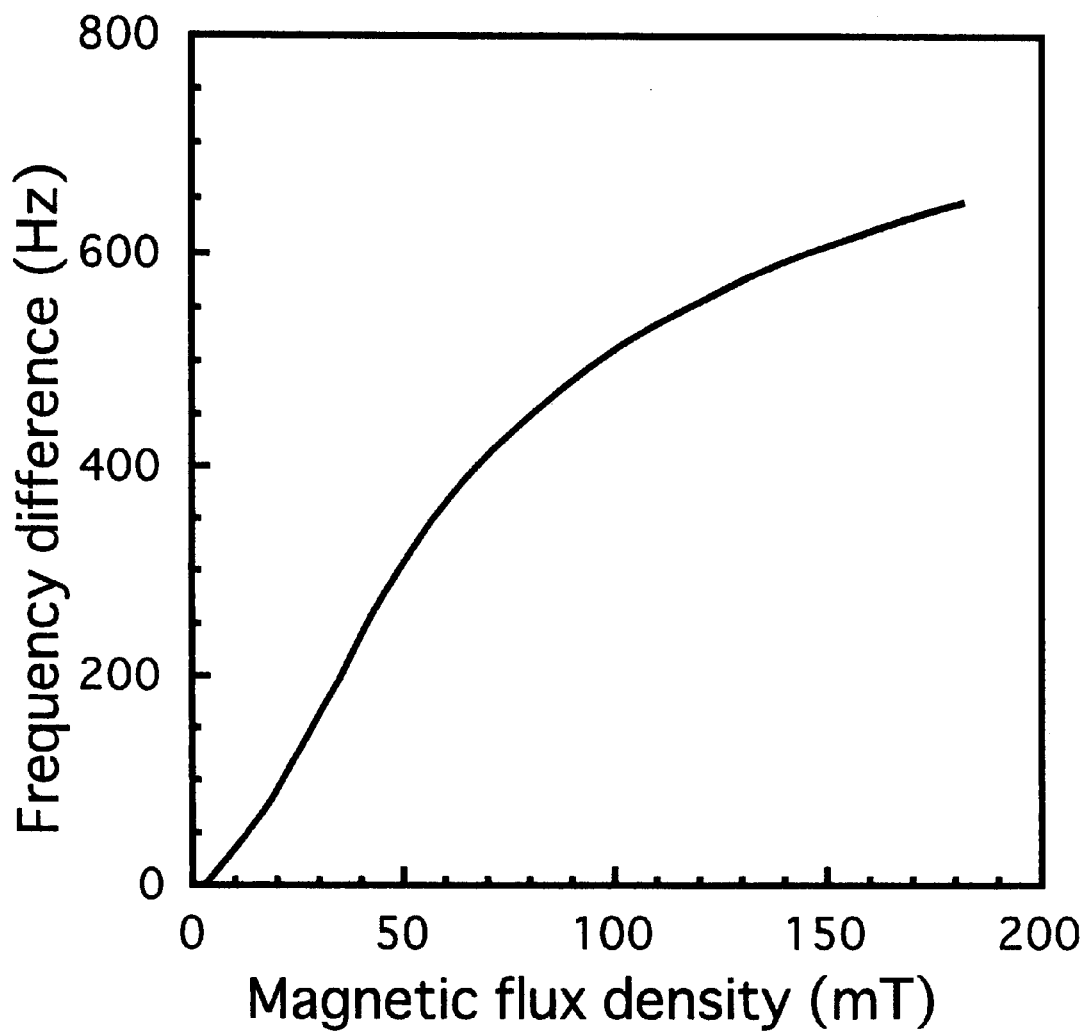
FIG. 4 shows a relationship between the magnetic flux density around ultrasonic fiber 11 and the frequency difference from the frequency of the delayed electric signal under a condition without a magnetic field.

FIG. 4 shows a relationship between the magnetic flux density around ultrasonic fiber 11 and the frequency difference from the frequency of the delayed electric signal under a condition without a magnetic field. The magnetic field around ultrasonic fiber 11 is caused electromagnetically. It is clear that the magnetic flux density is correlated with the frequency of the delayed electric signal. A change in frequency is due to a magneto-strictive effect of ultrasonic fiber 11 made of nickel. Thus, an electric current around ultrasonic fiber 11 can be sensed in terms of the frequency of the delayed electric signal.

Figure 5:
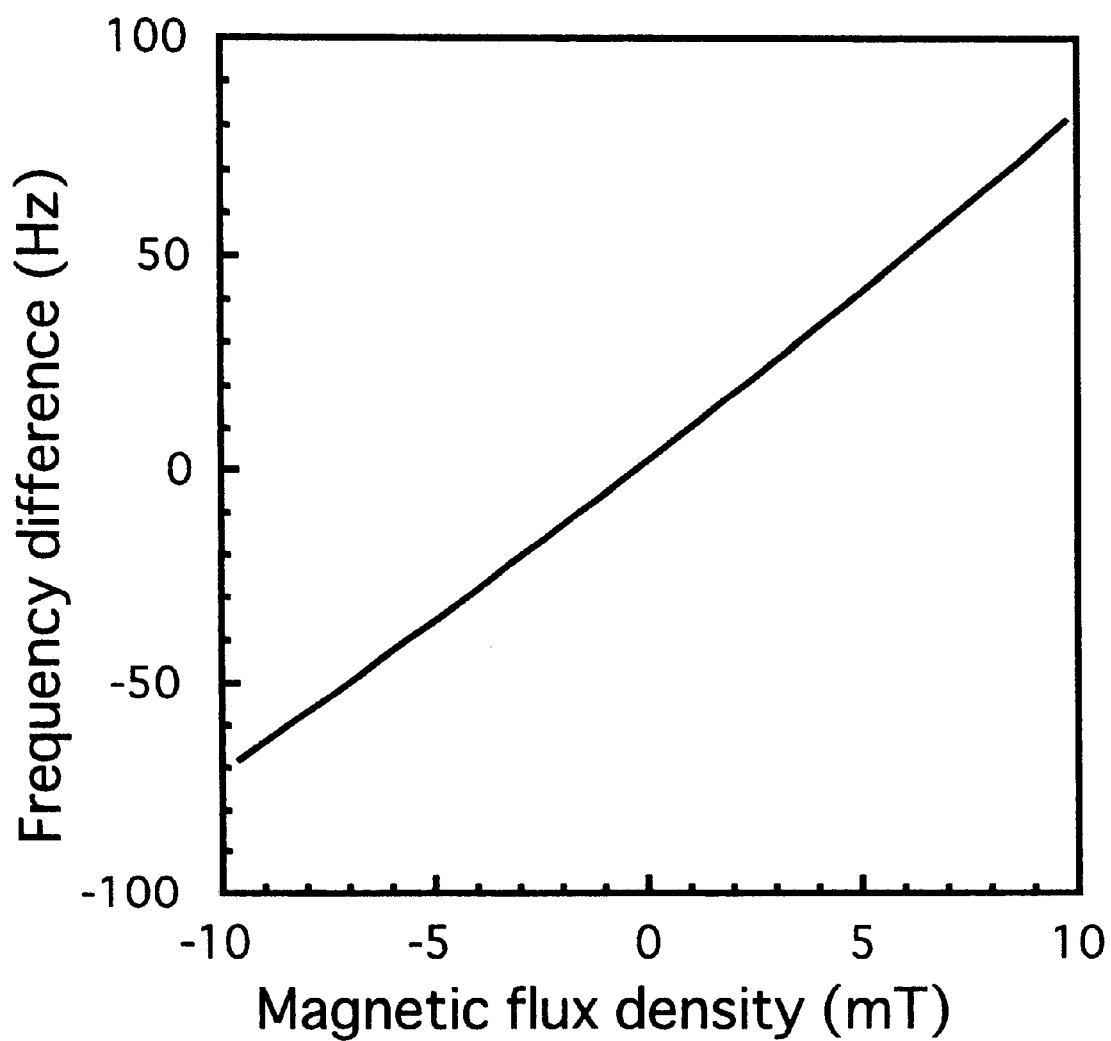
FIG. 5 shows a relationship between the magnetic flux density around ultrasonic fiber 11 and the frequency difference from the frequency of the delayed electric signal under the condition without a magnetic field.

FIG. 5 shows a relationship between the magnetic flux density around ultrasonic fiber 11 and the frequency difference from the frequency of the delayed electric signal under the condition without a magnetic field. The magnetic field around ultrasonic fiber 11 is caused by a permanent magnet. Minus signs in FIG. 5 mean reverse directions of the magnetic field. It is clear that the magnetic flux density is correlated with the frequency of the delayed electric signal. Accordingly, an electric current around ultrasonic fiber 11 can be sensed in terms of the frequency of the delayed electric signal.

Figure 6:
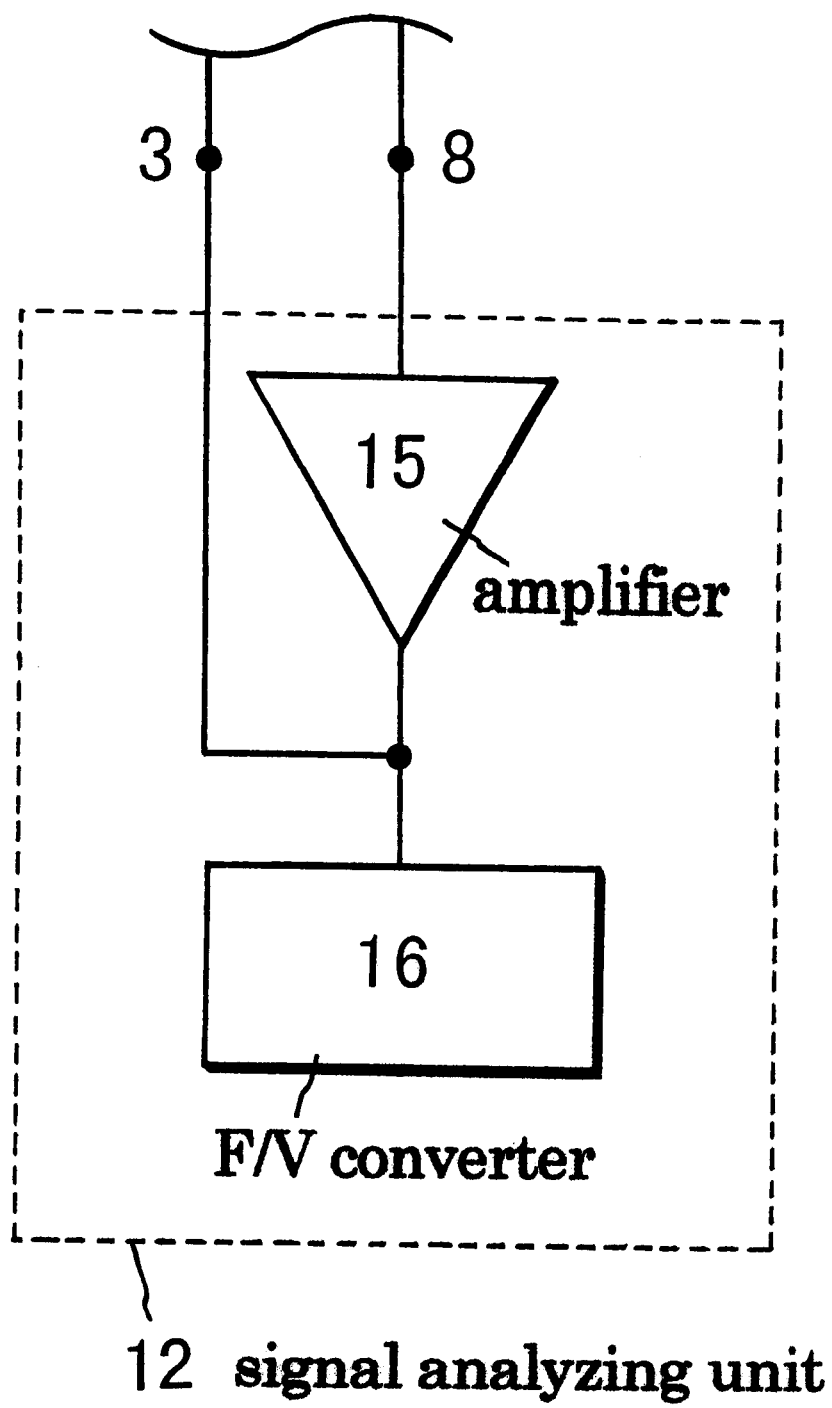
FIG. 6 shows a diagram of signal analyzing unit 12 according to a second embodiment.

FIG. 6 shows a diagram of signal analyzing unit 12 according to a second embodiment. Signal analyzing unit 12 comprises amplifier 15 and frequency to voltage (F/V) converter 16.

In the electric-current sensing device in FIG. 1 having signal analyzing unit 12 in FIG. 6, if an input electric signal is applied to input piezoelectric vibrator 1 through driving electrode 2 and input ground electrode 4, input piezoelectric vibrator 1 is acoustically vibrated. The acoustic vibration is transmitted to input vibrating plate 5, ultrasonic fiber 11, output vibrating plate 10 and output piezoelectric vibrator 6 in turn, and then detected between detecting electrode 7 and output ground electrode 9, as a delayed electric signal. The delayed electric signal is amplified via amplifier 15. A part of an amplified electric signal is applied to input piezoelectric vibrator 1 through driving electrode 2 and input ground electrode 4 again. Thus, input piezoelectric vibrator 1, input vibrating plate 5, ultrasonic fiber 11, output vibrating plate 10, output piezoelectric vibrator 6 and amplifier 15 form a self-oscillation type of delay-line oscillator. On the other hand, a remaining part of the amplified electric signal is transmitted to F/V converter 16. If ultrasonic fiber 11 is left in the magnetic field, a voltage of an F/V converted electric signal is changed in accordance with an intensity in magnetic field. Therefore, an electric current around ultrasonic fiber 11 can be sensed in terms of the voltage of the F/V converted electric signal.

Figure 7:
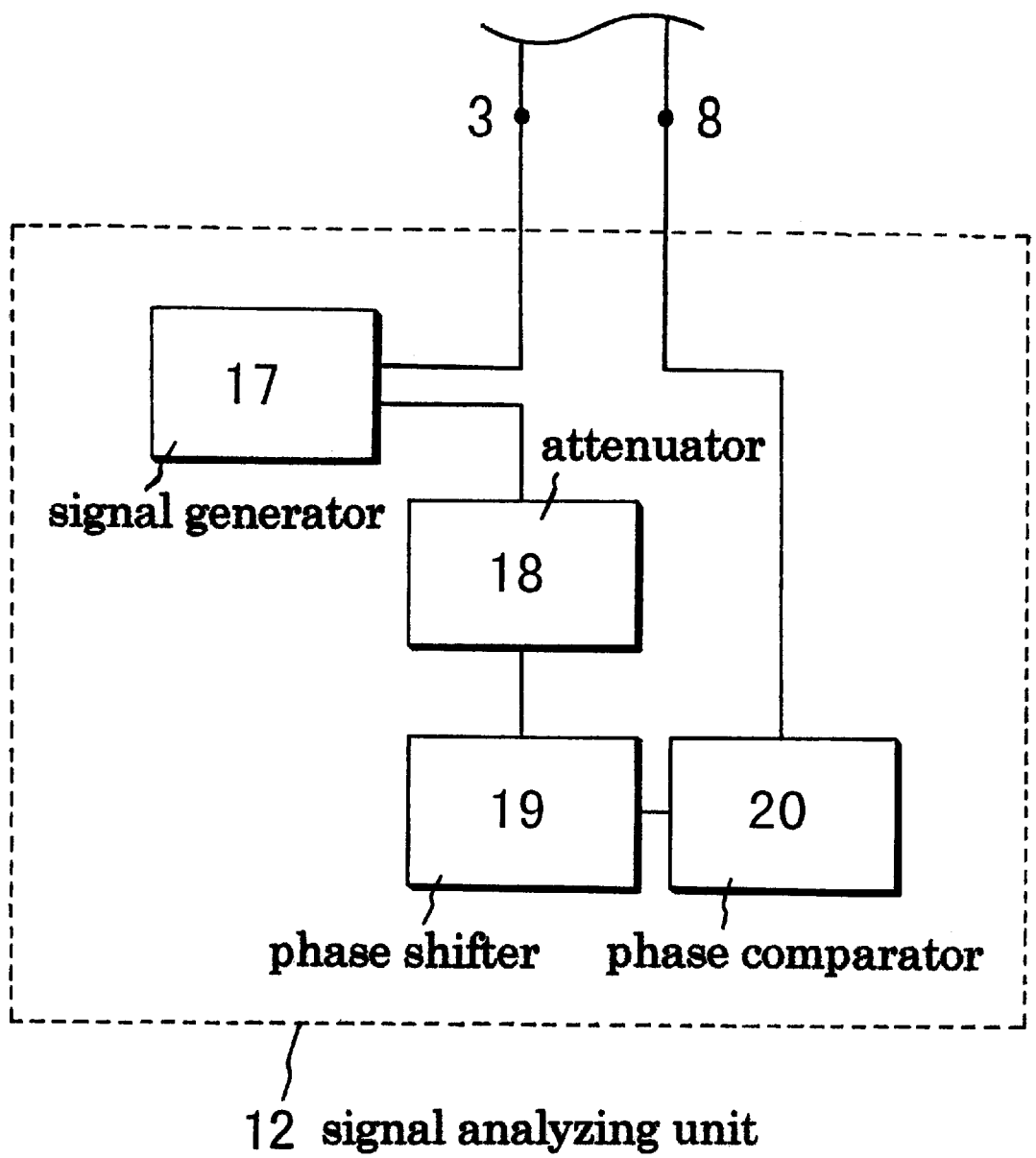
FIG. 7 shows a diagram of signal analyzing unit 12 according to a third embodiment.

FIG. 7 shows a diagram of signal analyzing unit 12 according to a third embodiment. Signal analyzing unit 12 comprises signal generator 17, attenuator 18, phase shifter 19, and phase comparator 20.

In the electric-current sensing device in FIG. 1 having signal analyzing unit 12 in FIG. 7, if an input electric signal, from signal generator 17, is applied to input piezoelectric vibrator 1 through driving electrode 2 and input ground electrode 4, input piezoelectric vibrator 1 is acoustically vibrated. The acoustic vibration is transmitted to input vibrating plate 5, ultrasonic fiber 11, output vibrating plate 10 and output piezoelectric vibrator 6 in turn, and then detected between detecting electrode 7 and output ground electrode 9, as a delayed electric signal. A phase of the delayed electric signal is compared with that of the input electric signal at phase comparator 20. In this time, the phase of the input electric signal attenuated via attenuator 18, in case of sensing no electric current around ultrasonic fiber 11, is controlled to be coincident with that of the delayed electric signal by phase shifter 19. If ultrasonic fiber 11 is left in the magnetic field, the phase of the delayed electric signal is changed in accordance with an intensity in magnetic field. Therefore, an electric current around ultrasonic fiber 11 can be sensed in terms of a phase difference between the phase of the delayed electric signal and that of the input electric signal.

Figure 8:
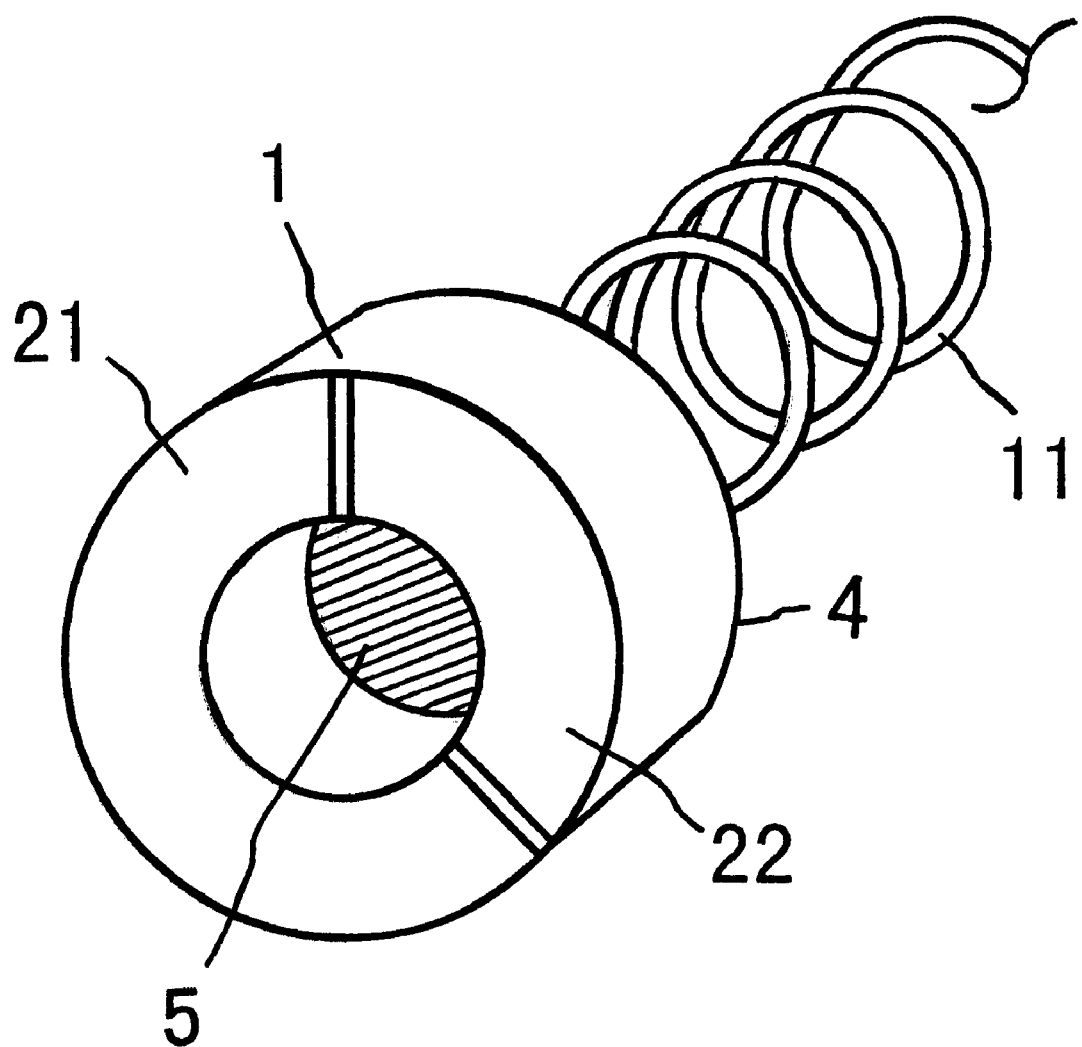
FIG. 8 shows a perspective view of another input ultrasonic transducer assembly used in place of the assembly in FIG. 2.

FIG. 8 shows a perspective view of another input ultrasonic transducer assembly used in place of the assembly in FIG. 2. Ultrasonic fiber 11 is also shown in FIG. 8. The input ultrasonic transducer assembly in FIG. 8 has the same construction as FIG. 2, except for using driving electrode 21 and feedback electrode 22 in place of driving electrode 2. Drive electrode 21 and feedback electrode 22 are electrically separated under a condition that an area of feedback electrode 22 on one end surface of input piezoelectric vibrator 1 is less than that of driving electrode 21 thereon.

Figure 9:
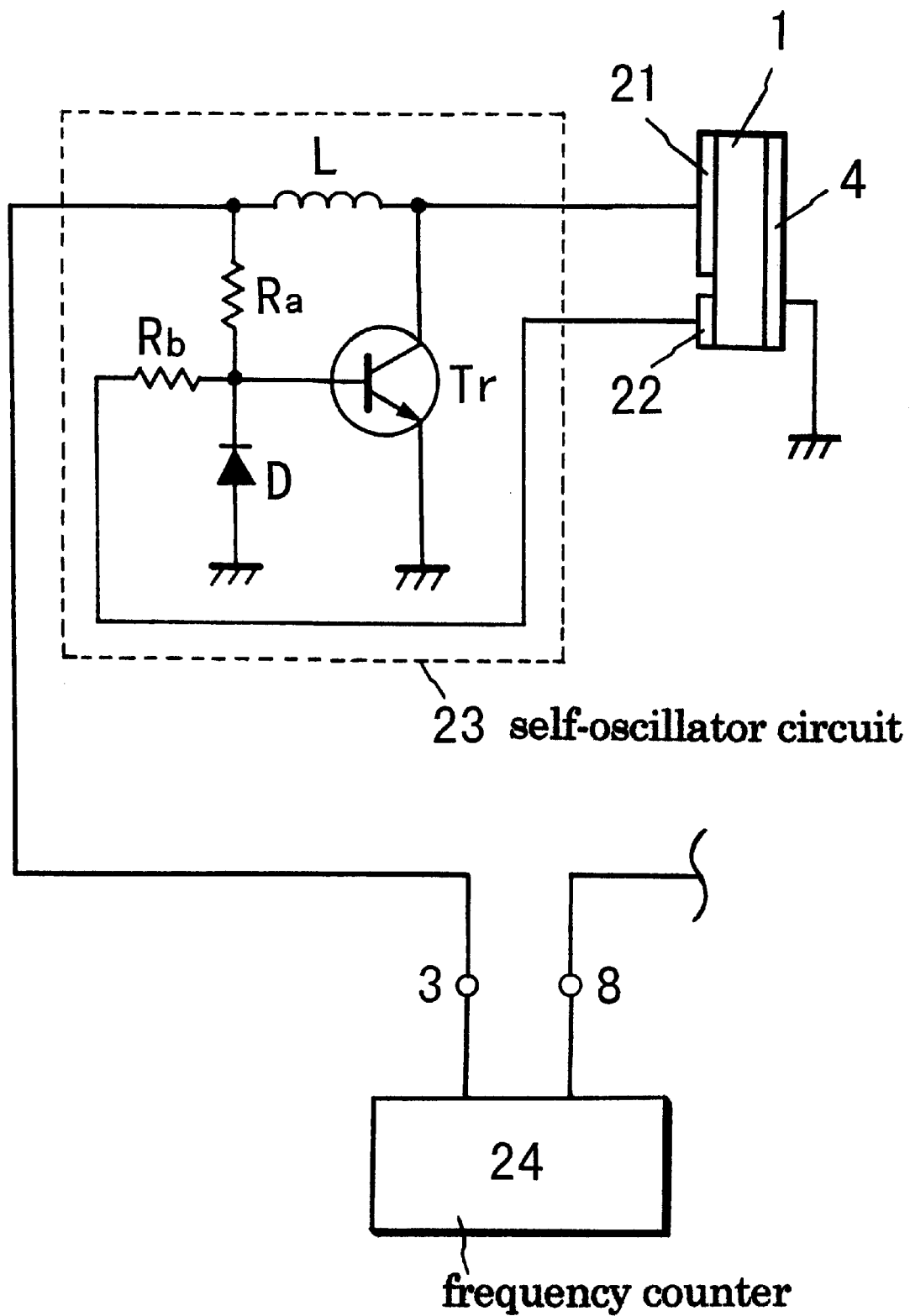
FIG. 9 shows a diagram of self-oscillator circuit 23 connected with the input ultrasonic transducer assembly in FIG. 8.

FIG. 9 shows a diagram of self-oscillator circuit 23 connected with the input ultrasonic transducer assembly in FIG. 8. Self-oscillator circuit 23 contains coil L, transistor Tr, diode D, and resistances Ra and Rb. If an input electric signal is applied to input piezoelectric vibrator 1 through driving electrode 21 and input ground electrode 4, input piezoelectric vibrator 1 is acoustically vibrated. An acoustic vibration caused in input piezoelectric vibrator 1 is not only transmitted to input vibrating plate 5, but also transduced between feedback electrode 22 and input ground electrode 4 to an electric signal, which is supplied to driving electrode 21 and input ground electrode 4 again. In this way, a positive feedback loop with a self-oscillation is constructed. Self-oscillator circuit 23 has been confirmed to be effective for continuous and stable acoustic vibration in input piezoelectric vibrator 1, and for large resonance-frequency deviation in input piezoelectric vibrator 1. In this embodiment, the best self-oscillation is realized in case that driving electrode 21 has three to four times as large area as feedback electrode 22. On the other hand, the acoustic vibration in input vibrating plate 5 is transmitted to the output ultrasonic transducer assembly in FIG. 1 through ultrasonic fiber 11, and transduced to a delayed electric signal. The delayed electric signal is transmitted to frequency counter 24. If ultrasonic fiber 11 is left in a magnetic field, a frequency of the delayed electric signal is changed in accordance with an intensity in magnetic field. Therefore, an electric current around ultrasonic fiber 11 can be sensed in terms of the frequency of the delayed electric signal. If using an F/V converter in place of frequency counter 24, an electric current around ultrasonic fiber 11 can be sensed in terms of the voltage of the F/V converted electric signal.

Figure 10:
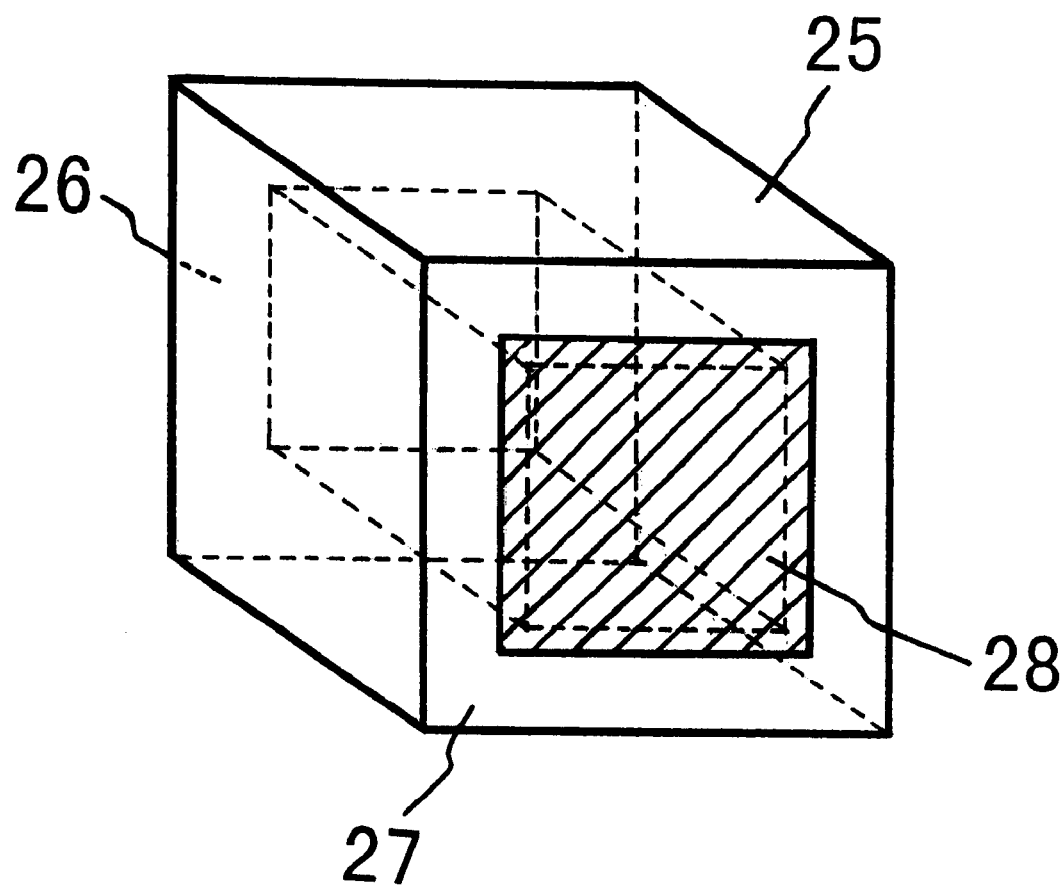
FIG. 10 shows a perspective view of a further input ultrasonic transducer assembly used in place of the assembly in FIG. 2.

FIG. 10 shows a perspective view of a further input ultrasonic transducer assembly used in place of the assembly in FIG. 2. When using the input ultrasonic transducer assembly in FIG. 10, the output ultrasonic transducer assembly with the same construction as the input ultrasonic transducer assembly in FIG. 10 is used. The input ultrasonic transducer assembly in FIG. 10 comprises input piezoelectric vibrator 25, driving electrode 26, input ground electrode 27 and input vibrating plate 28. Input piezoelectric vibrator 25, made of a piezoelectric ceramic, has a square pillar-shaped body with the same shaped pierced hall parallel to the thickness direction thereof. The direction of the polarization axis of input piezoelectric vibrator 25 is parallel to the thickness direction thereof. Input piezoelectric vibrator 25 has dimensions of 8 mm in length, 8 mm in width and 6 mm in thickness. Drive electrode 26 and input ground electrode 27, made of an aluminum thin film, are formed on two end surfaces of input piezoelectric vibrator 25, respectively. Input vibrating plate 28 is made of stainless steel and has a square plate-shaped body with dimensions of 5.5 mm in length, 5.5 mm in width and 50 $\mu$m in thickness. Input vibrating plate 28 is cemented to input piezoelectric vibrator 25 such that input vibrating plate 28 covers an opening of the pierced hall of input piezoelectric vibrator 25. The input ultrasonic transducer assembly in FIG. 10 has the same function as FIG. 1.

Figure 11:
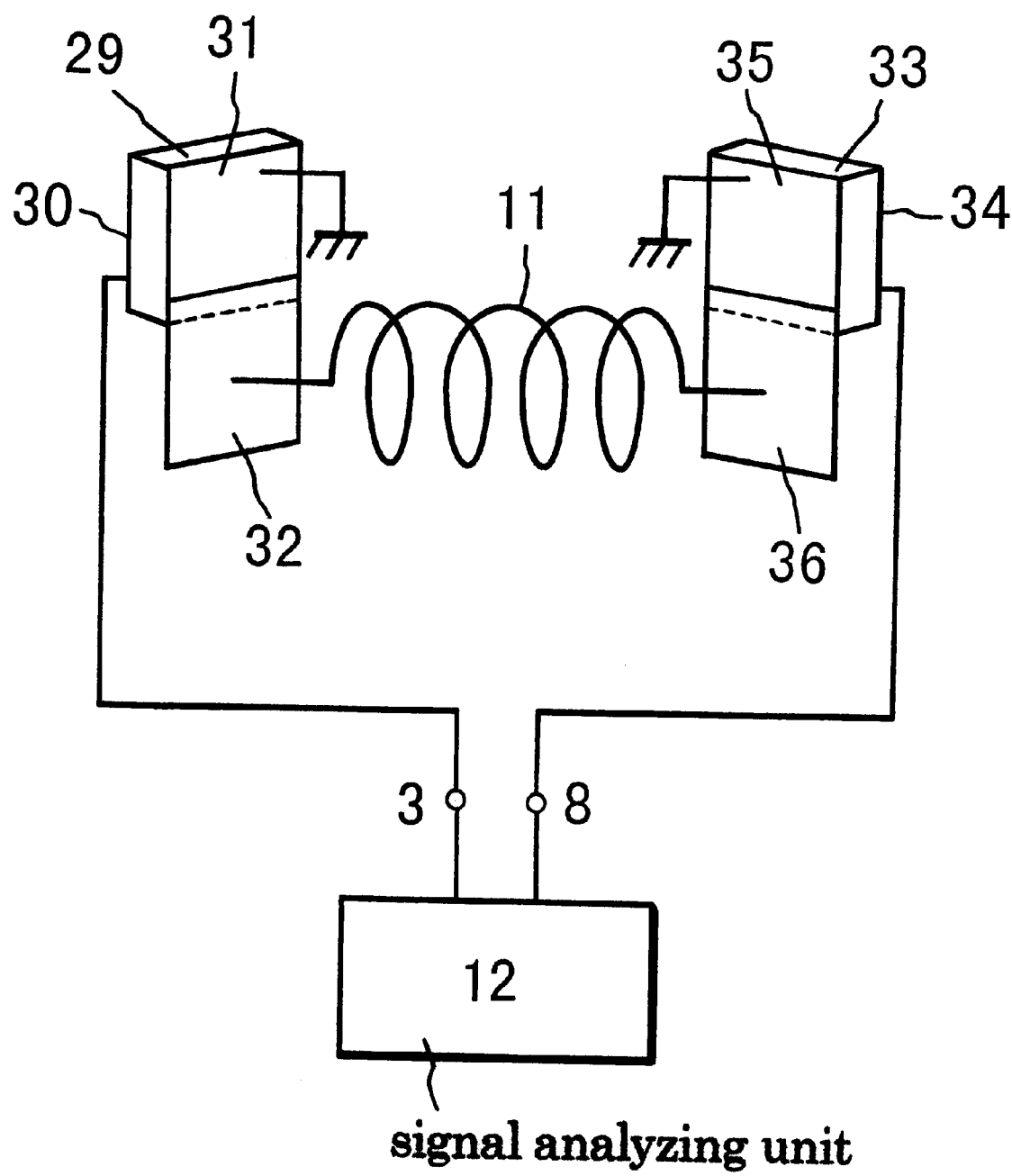
FIG. 11 shows a schematic illustration of an electric-current sensing device according to a second embodiment of the present invention.

FIG. 11 shows a schematic illustration of an electric-current sensing device according to a second embodiment of the present invention. The electric-current sensing device in FIG. 11 has an input ultrasonic transducer assembly comprising input piezoelectric vibrator 29, driving electrode 30, input ground electrode 31 and input vibrating plate 32, and output ultrasonic transducer assembly comprising output piezoelectric vibrator 33, detecting electrode 34, output ground electrode 35 and output vibrating plate 36. The electric-current sensing device in FIG. 11 has the same construction as FIG. 1, except for the input- and output ultrasonic transducer assemblies. Input piezoelectric vibrator 29, made of a piezoelectric ceramic, has a plate-shaped body with dimensions of 17 mm in length, 20 mm in width and 1 mm in thickness. The direction of the polarization axis of input piezoelectric vibrator 29 is parallel to the thickness direction thereof. Drive electrode 30 and input ground electrode 31, made of aluminum thin film, are formed on two end surfaces of input piezoelectric vibrator 29, respectively. Input vibrating plate 32, made of stainless steel with dimensions of 20 mm in length, 20 mm in width and 50 $\mu$m in thickness, is cemented to input piezoelectric vibrator 29 through input ground electrode 31 such that input vibrating plate 32 projects like a spring board. A tip of ultrasonic fiber 11 is cemented to the center of input vibrating plate 32. The output ultrasonic transducer assembly is the same construction as the input ultrasonic transducer assembly. The electric-current sensing device in FIG. 11 has the same function as FIG. 1.

Figure 12:
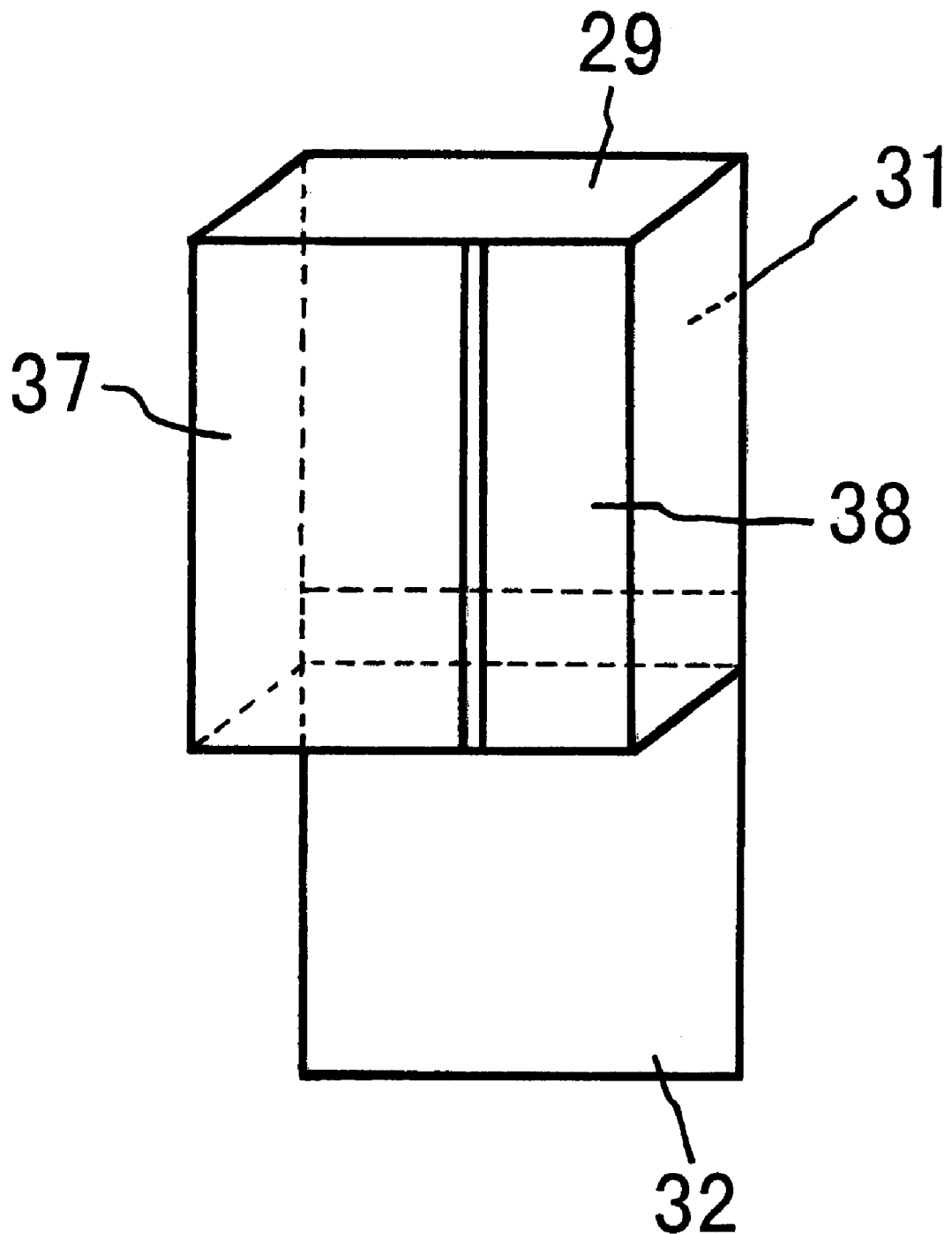
FIG. 12 shows a perspective view of another input ultrasonic transducer assembly used in place of the assembly in FIG. 11.

FIG. 12 shows a perspective view of another input ultrasonic transducer assembly used in place of the assembly in FIG. 11. The input ultrasonic transducer assembly in FIG. 12 has the same construction as FIG. 11, except for using driving electrode 37 and feedback electrode 38 in place of driving electrode 30. Drive electrode 37 and feedback electrode 38 are electrically separated under a condition that an area of feedback electrode 38 on one end surface of input piezoelectric vibrator 29 is less than that of driving electrode 37 thereon. The input ultrasonic transducer assembly in FIG. 12 has the same function as FIG. 8.

Figure 13:
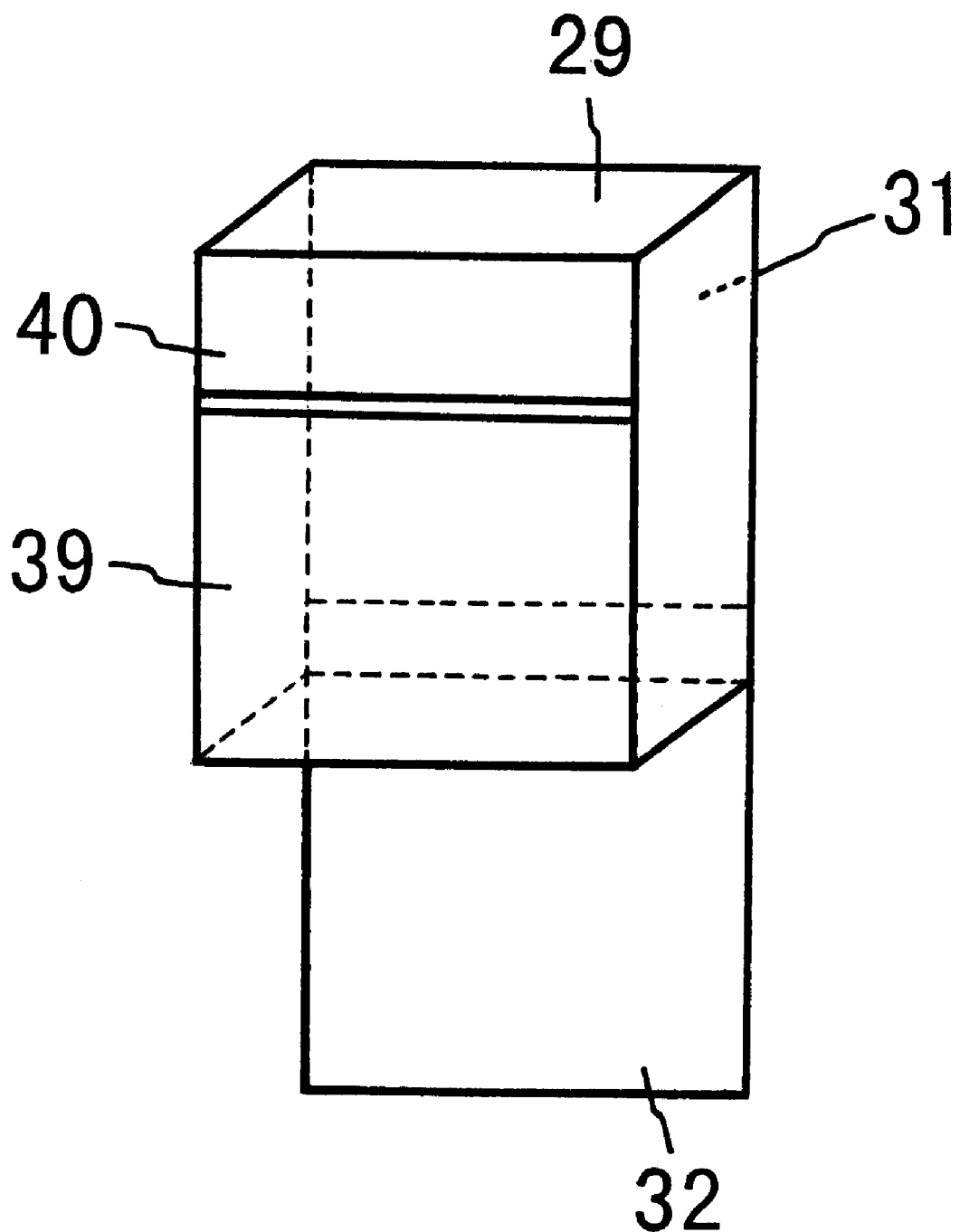
FIG. 13 shows a perspective view of a further input ultrasonic transducer assembly used in place of the assembly in FIG. 11.

FIG. 13 shows a perspective view of a further input ultrasonic transducer assembly used in place of the assembly in FIG. 11. The input ultrasonic transducer assembly in FIG. 13 has the same construction as FIG. 12, except for the direction of a dividing line between driving electrode 39 and feedback electrode 40. The direction of the dividing line is vertical to that in FIG. 12. The input ultrasonic transducer assembly in FIG. 13 has the same function as FIG. 8.

Figure 14:
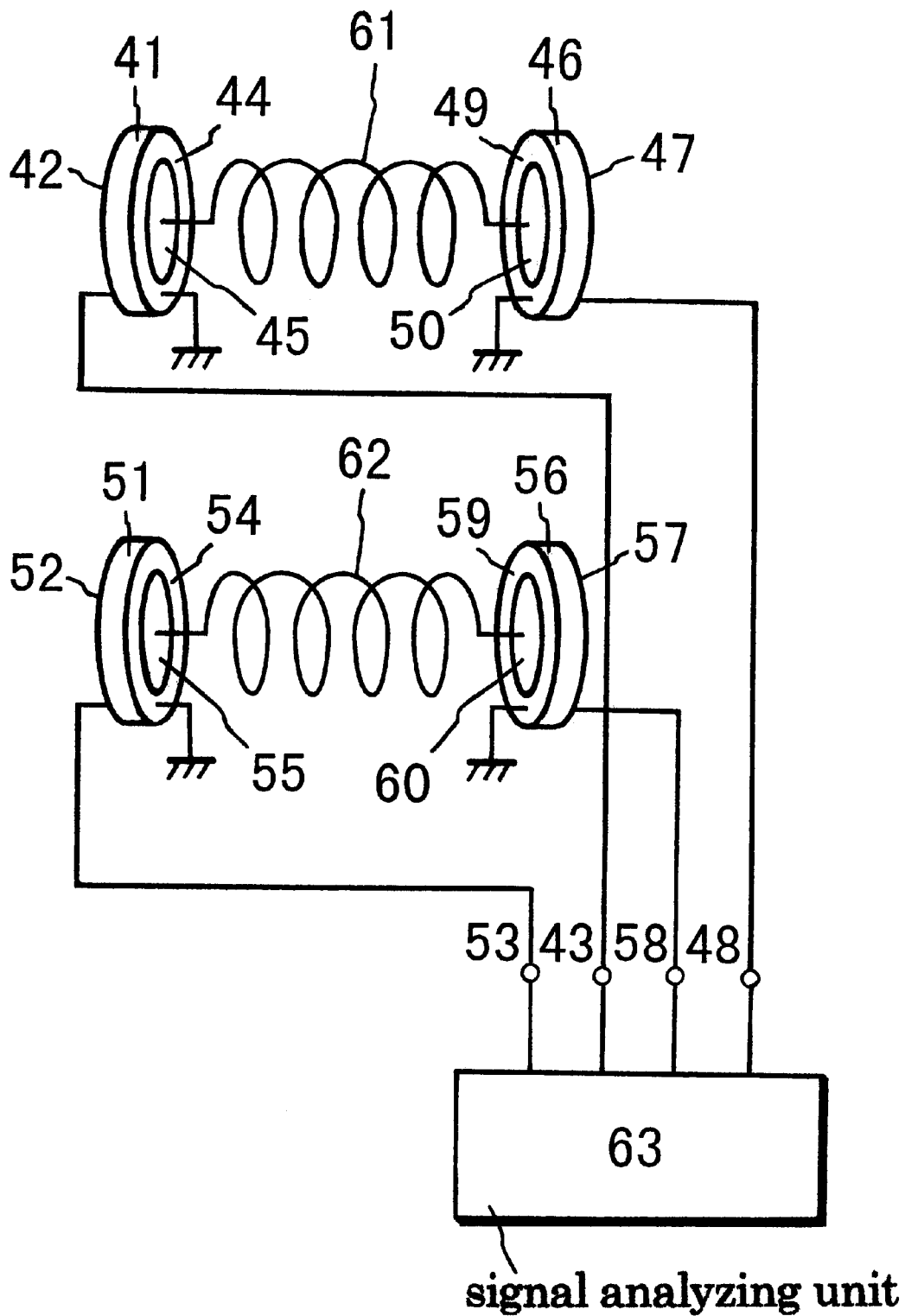
FIG. 14 shows a schematic illustration of an electric-current sensing device according to a third embodiment of the present invention.

FIG. 14 shows a schematic illustration of an electric-current sensing device according to a third embodiment of the present invention. The electric-current sensing device comprises a measurement input ultrasonic transducer assembly, a measurement output ultrasonic transducer assembly, a reference input ultrasonic transducer assembly, a reference output ultrasonic transducer assembly, measurement ultrasonic fiber 61, reference ultrasonic fiber 62 and signal analyzing unit 63. The measurement input ultrasonic transducer assembly comprises measurement input piezoelectric vibrator 41, measurement driving electrode 42 having input terminal 43, measurement input ground electrode 44 and measurement input vibrating plate 45, and has the same construction as the input ultrasonic transducer assembly in FIG. 1. The measurement output ultrasonic transducer assembly comprises measurement output piezoelectric vibrator 46, measurement detecting electrode 47 having output terminal 48, measurement output ground electrode 49 and measurement output vibrating plate 50, and has the same construction as the output ultrasonic transducer assembly in FIG. 1. The reference input ultrasonic transducer assembly comprises reference input piezoelectric vibrator 51, reference driving electrode 52 having input terminal 53, reference input ground electrode 54 and reference input vibrating plate 55, and has the same construction as the measurement input ultrasonic transducer assembly. The reference output transducer assembly comprises reference output piezoelectric vibrator 56, reference detecting electrode 57 having output terminal 58, reference output ground electrode 59 and reference output vibrating plate 60, and has the same construction as the measurement output ultrasonic transducer assembly. Measurement ultrasonic fiber 61 and reference ultrasonic fiber 62 have the same construction as ultrasonic fiber 11. Reference ultrasonic fiber 62 is kept out of the influence of the magnetic field.

Figure 15:
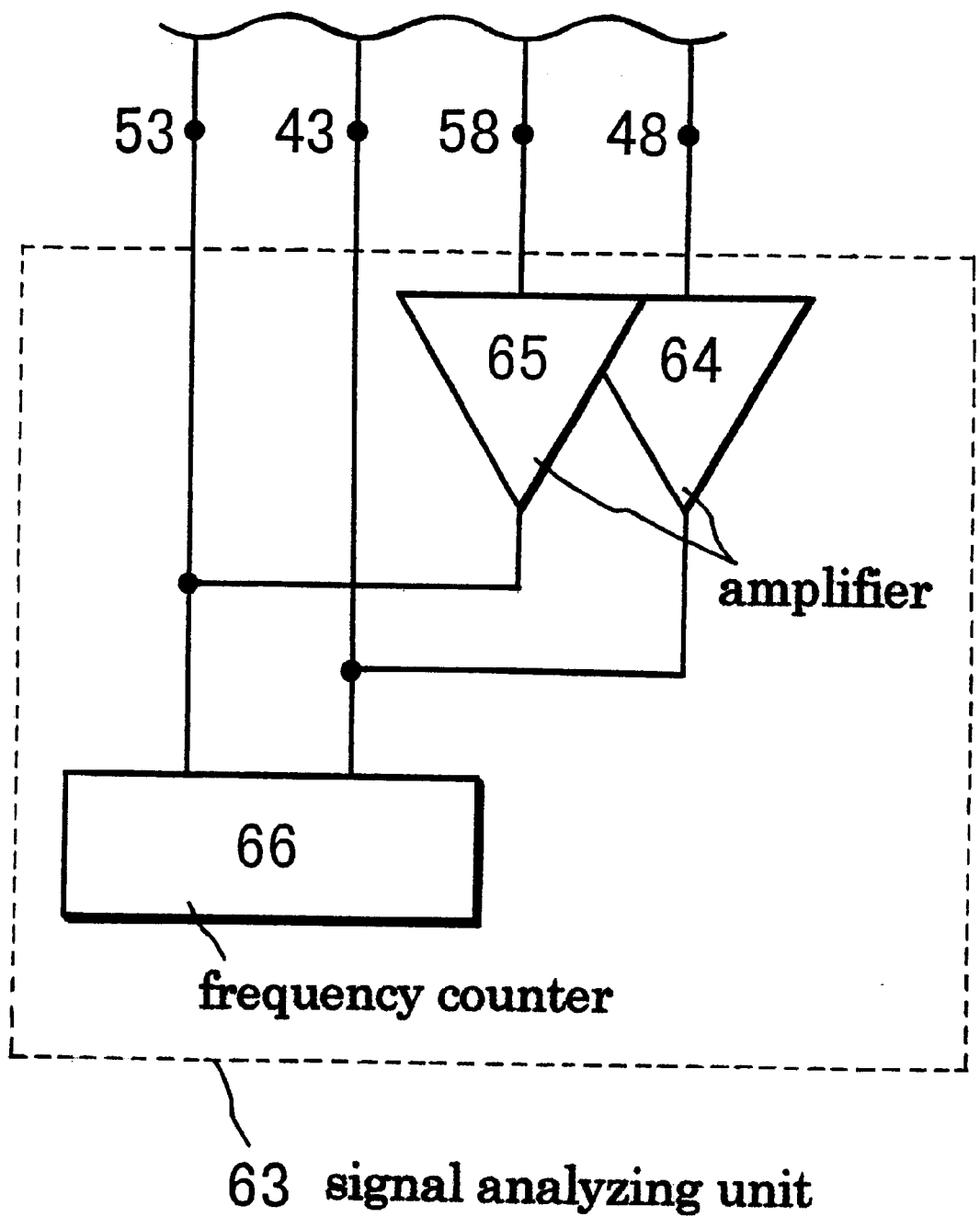
FIG. 15 shows a diagram of signal analyzing unit 63 according to an embodiment.

FIG. 15 shows a diagram of signal analyzing unit 63 according to an embodiment. Signal analyzing unit 63 comprises amplifiers 64 and 65 and frequency counter 66.

In the electric-current sensing device in FIG. 14 having signal analyzing unit 63 in FIG. 15, measurement input piezoelectric vibrator 41, measurement input vibrating plate 45, measurement ultrasonic fiber 61, measurement output vibrating plate 50, measurement output piezoelectric vibrator 46 and amplifier 64 form a self-oscillation type of delay-line oscillator. In the same way, reference input piezoelectric vibrator 51, reference input vibrating plate 55, reference ultrasonic fiber 62, reference output vibrating plate 60, reference output piezoelectric vibrator 56 and amplifier 65 form a self-oscillation type of delay-line oscillator. Thus, an acoustic vibration caused in measurement input piezoelectric vibrator 41 by supplying measurement input piezoelectric vibrator 41 with an electric signal is transmitted to measurement output piezoelectric vibrator 46, and detected as a measurement delayed electric signal, which is amplified via amplifier 64. On the other hand, an acoustic vibration caused in reference input piezoelectric vibrator 51 by supplying reference input piezoelectric vibrator 51 with an electric signal is transmitted to reference output piezoelectric vibrator 56, and detected as a reference delayed electric signal, which is amplified via amplifier 65. If measurement ultrasonic fiber 61 is left in a magnetic field, a frequency of an amplified electric signal via amplifier 64 is changed in accordance with an intensity in magnetic field. Accordingly, an electric current around measurement ultrasonic fiber 61 is sensed in terms of a frequency difference between the frequency of the amplified electric signal via amplifier 64 and a reference frequency of an amplified electric signal via amplifier 65.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An electric-current sensing device comprising:
   an input ultrasonic transducer assembly consisting of
      an input piezoelectric vibrator having two end surfaces perpendicular to the thickness direction thereof,
      a driving electrode formed on one end surface of said input piezoelectric vibrator,
      an input ground electrode formed on the other end surface of said input piezoelectric vibrator, and
      an input vibrating plate cemented to said input piezoelectric vibrator through said input ground electrode;
   an output ultrasonic transducer assembly consisting of
      an output piezoelectric vibrator having two end surfaces perpendicular to the thickness direction thereof,
      a detecting electrode formed on one end surface of said output piezoelectric vibrator,
      an output ground electrode formed on the other end surface of said output piezoelectric vibrator, and
      an output vibrating plate cemented to said output piezoelectric vibrator through said output ground electrode; and
   an ultrasonic fiber made of a magneto-strictive delay line and connected between said input vibrating plate and said output vibrating plate,
      said driving electrode and said input ground electrode receiving an input electric signal and causing said input piezoelectric vibrator to vibrate acoustically,
      said input piezoelectric vibrator transmitting an acoustic vibration therein to said output piezoelectric vibrator through said ultrasonic fiber,
      said detecting electrode and said output ground electrode detecting an acoustic vibration transmitted to said output piezoelectric vibrator as a delayed electric signal, and sensing an electric current around said ultrasonic fiber from said delayed electric signal, which changes in response to an intensity in magnetic field around said ultrasonic fiber.

2. An electric-current sensing device as defined in claim 1, wherein said ultrasonic fiber has a coil-shaped structure.

3. An electric-current sensing device as defined in claim 1, wherein each of said input- and output piezoelectric vibrators is made of a piezoelectric ceramic, of which the polarization axis is parallel to the thickness direction thereof.

4. An electric-current sensing device as defined in claim 1, wherein each of said input- and output piezoelectric vibrators has a square pillar-shaped body with the same shaped pierced hall parallel to the thickness direction thereof, said input vibrating plate is cemented to said input piezoelectric vibrator such that said input vibrating plate covers an opening of said pierced hall of said input piezoelectric vibrator, and said output vibrating plate is cemented to said output piezoelectric vibrator such that said output vibrating plate covers an opening of said pierced hall of said output piezoelectric vibrator.

5. An electric-current sensing device as defined in claim 1, wherein each of said input- and output piezoelectric vibrators has a square pillar-shaped body with the same shaped pierced hall parallel to the thickness direction thereof, the shortest distance between an outer- and an inner edges on an end surface of said body is approximately equal to the thickness thereof, said input vibrating plate is cemented to said input piezoelectric vibrator such that said input vibrating plate covers an opening of said pierced hall of said input piezoelectric vibrator, and said output vibrating plate is cemented to said output piezoelectric vibrator such that said output vibrating plate covers an opening of said pierced hall of said output piezoelectric vibrator.

6. An electric-current sensing device as defined in claim 1, wherein each of said input- and output piezoelectric vibrators has a cylindrical-shaped body with the same shaped pierced hall parallel to the thickness direction thereof, said input vibrating plate is cemented to said input piezoelectric vibrator such that said input vibrating plate covers an opening of said pierced hall of said input piezoelectric vibrator, and said output vibrating plate is cemented to said output piezoelectric vibrator such that said output vibrating plate covers an opening of said pierced hall of said output piezoelectric vibrator.

7. An electric-current sensing device as defined in claim 1, wherein each of said input- and output piezoelectric vibrators has a cylindrical-shaped body with the same shaped pierced hall parallel to the thickness direction thereof, the shortest distance between an outer- and an inner edges on an end surface of said body is approximately equal to the thickness thereof, said input vibrating plate is cemented to said input piezoelectric vibrator such that said input vibrating plate covers an opening of said pierced hall of said input piezoelectric vibrator, and said output vibrating plate is cemented to said output piezoelectric vibrator such that said output vibrating plate covers an opening of said pierced hall of said output piezoelectric vibrator.

8. An electric-current sensing device as defined in claim 1, wherein each of said input- and output piezoelectric vibrators has an approximately square plate-shaped body, said input vibrating plate is cemented to said input piezoelectric vibrator such that said input vibrating plate projects like a springboard, and said output vibrating plate is cemented to said output piezoelectric vibrator such that said output vibrating plate projects like a springboard.

9. An electric-current sensing device as defined in claim 1, wherein each of said input- and output piezoelectric vibrators has an approximately square pillar-shaped body, said input vibrating plate is cemented to said input piezoelectric vibrator such that said input vibrating plate projects like a springboard, and said output vibrating plate is cemented to said output piezoelectric vibrator such that said output vibrating plate projects like a springboard.

10. An electric-current sensing device as defined in claim 1 further comprising a signal analyzing unit consisting of an amplifier amplifying said delayed electric signal and supplying said driving electrode and said input ground electrode with a part of an amplified electric signal, said input piezoelectric vibrator, said input vibrating plate, said ultrasonic fiber, said output vibrating plate, said output piezoelectric vibrator and said amplifier forming a delay-line oscillator, and a frequency counter receiving a remaining part of said amplified electric signal and sensing said electric current around said ultrasonic fiber in terms of a frequency of said amplified electric signal.

11. An electric-current sensing device as defined in claim 1 further comprising a signal analyzing unit consisting of an amplifier amplifying said delayed electric signal and supplying said driving electrode and said input ground electrode with a part of an amplified electric signal, said input piezoelectric vibrator, said input vibrating plate, said ultrasonic fiber, said output vibrating plate, said output piezoelectric vibrator and said amplifier forming a delay-line oscillator, and a frequency to voltage converter receiving a remaining part of said amplified electric signal and sensing said electric current around said ultrasonic fiber in terms of a voltage of a converted electric signal.

12. An electric-current sensing device as defined in claim 1 further comprising a signal analyzing unit consisting of a signal generator generating said input electric signal, and a phase comparator sensing said electric current around said ultrasonic fiber in terms of a phase difference between a phase of said input electric signal and that of said delayed electric signal.

13. An electric-current sensing device as defined in claim 1 further comprising a feedback electrode formed on said one end surface of said input piezoelectric vibrator such that said driving electrode and said feedback electrode are electrically separated, and that an area of said feedback electrode on said one end surface is less than that of said driving electrode thereon, said feedback electrode and said input ground electrode transducing the acoustic vibration between said feedback electrode and said input ground electrode to an electric signal, and supplying said driving electrode and said input ground electrode with a transduced electric signal again.

14. An electric-current sensing device comprising:

a measurement input ultrasonic transducer assembly consisting of
  a measurement input piezoelectric vibrator having two end surfaces perpendicular to the thickness direction thereof,
  a measurement driving electrode formed on one end surface of said measurement input piezoelectric vibrator,
  a measurement input ground electrode formed on the other end surface of said measurement input piezoelectric vibrator, and
  a measurement input vibrating plate cemented to said measurement input piezoelectric vibrator through said measurement input ground electrode;

a measurement output ultrasonic transducer assembly consisting of
  a measurement output piezoelectric vibrator having two end surfaces perpendicular to the thickness direction thereof,
  a measurement detecting electrode formed on one end surface of said measurement output piezoelectric vibrator,
  a measurement output ground electrode formed on the other end surface of said measurement output piezoelectric vibrator, and
  a measurement output vibrating plate cemented to said measurement output piezoelectric vibrator through said measurement output ground electrode;

a measurement ultrasonic fiber made of a magneto-strictive delay line and connected between said measurement input vibrating plate and said measurement output vibrating plate;

a reference input ultrasonic transducer assembly consisting of
  a reference input piezoelectric vibrator having two end surfaces perpendicular to the thickness direction thereof,
  a reference driving electrode formed on one end surface of said reference input piezoelectric vibrator,
  a reference input ground electrode formed on the other end surface of said reference input piezoelectric vibrator, and
  a reference input vibrating plate cemented to said reference input piezoelectric vibrator through said reference input ground electrode;

a reference output ultrasonic transducer assembly consisting of
  a reference output piezoelectric vibrator having two end surfaces perpendicular to the thickness direction thereof,
  a reference detecting electrode formed on one end surface of said reference output piezoelectric vibrator,
  a reference output ground electrode formed on the other end surface of said reference output piezoelectric vibrator, and
  a reference output vibrating plate cemented to said reference output piezoelectric vibrator through said reference output ground electrode;

a reference ultrasonic fiber made of a magneto-strictive delay line and connected between said reference input vibrating plate and said reference output vibrating plate, said reference ultrasonic fiber being kept out of the influence of the magnetic field; and a signal analyzing unit,
  said reference driving electrode and said reference input ground electrode receiving an input electric signal and causing said reference input piezoelectric vibrator to vibrate acoustically,
  said reference input piezoelectric vibrator transmitting an acoustic vibration therein to said reference output piezoelectric vibrator through said reference ultrasonic fiber,
  said reference detecting electrode and said reference output ground electrode detecting an acoustic vibration transmitted to said reference output piezoelectric vibrator as a reference delayed electric signal,
  said measurement driving electrode and said measurement input ground electrode receiving an input electric signal and causing said measurement input piezoelectric vibrator to vibrate acoustically,
  said measurement input piezoelectric vibrator transmitting an acoustic vibration to said measurement output piezoelectric vibrator through said measurement ultrasonic fiber,
  said measurement detecting electrode and said measurement output ground electrode detecting an acoustic vibration transmitted to said measurement output piezoelectric vibrator as a measurement delayed electric signal, and
  said signal analyzing unit sensing an electric current around said measurement ultrasonic fiber from a difference between said reference delayed electric signal and said measurement delayed electric signal, which changes in response to an intensity in magnetic field around said measurement ultrasonic fiber.

15. An electric-current sensing device as defined in claim 14, wherein said measurement ultrasonic fiber and said reference ultrasonic fiber have a coil-shaped structure, respectively.

16. An electric-current sensing device as defined in claim 14, wherein said measurement input- and output piezoelectric vibrators and said reference input- and output piezoelectric vibrators are made of a piezoelectric ceramic, respectively, of which the polarization axis is parallel to the thickness direction thereof.

17. An electric-current sensing device as defined in claim 14, wherein said measurement input- and output piezoelectric vibrators and said reference input- and output piezoelectric vibrators have a square pillar-shaped body with the same shaped pierced hall parallel to the thickness direction thereof, respectively, said measurement input vibrating plate is cemented to said measurement input piezoelectric vibrator such that said measurement input vibrating plate covers an opening of said pierced hall of said measurement input piezoelectric vibrator, said measurement output vibrating plate is cemented to said measurement output piezoelectric vibrator such that said measurement output vibrating plate covers an opening of said pierced hall of said measurement output piezoelectric vibrator, said reference input vibrating plate is cemented to said reference input piezoelectric vibrator such that said reference input vibrating plate covers an opening of said pierced hall of said reference input piezoelectric vibrator, and said reference output vibrating plate is cemented to said reference output piezoelectric vibrator such that said reference output vibrating plate covers an opening of said pierced hall of said reference output piezoelectric vibrator.

18. An electric-current sensing device as defined in claim 14, wherein said measurement input- and output piezoelectric vibrators and said reference input- and output piezoelectric vibrators have a cylindrical-shaped body with the same shaped pierced hall parallel to the thickness direction thereof, respectively, said measurement input vibrating plate is cemented to said measurement input piezoelectric vibrator such that said measurement input vibrating plate covers an opening of said pierced hall of said measurement input piezoelectric vibrator, said measurement output vibrating plate is cemented to said measurement output piezoelectric vibrator such that said measurement output vibrating plate covers an opening of said pierced hall of said measurement output piezoelectric vibrator, said reference input vibrating plate is cemented to said reference input piezoelectric vibrator such that said reference input vibrating plate covers an opening of said pierced hall of said reference input piezoelectric vibrator, and said reference output vibrating plate is cemented to said reference output piezoelectric vibrator such that said reference output vibrating plate covers an opening of said pierced hall of said reference output piezoelectric vibrator.

19. An electric-current sensing device as defined in claim 14, wherein said measurement input- and output piezoelectric vibrators and said reference input- and output piezoelectric vibrators have an approximately square plate-shaped body, respectively, said measurement input vibrating plate is cemented to said measurement input piezoelectric vibrator such that said measurement input vibrating plate projects like a springboard, said measurement output vibrating plate is cemented to said measurement output piezoelectric vibrator such that said measurement output vibrating plate projects like a springboard, said reference input vibrating plate is cemented to said reference input piezoelectric vibrator such that said reference input vibrating plate projects like a springboard, and said reference output vibrating plate is cemented to said reference output piezoelectric vibrator such that said reference output vibrating plate projects like a springboard.

20. An electric-current sensing device as defined in claim 14, wherein said measurement input- and output piezoelectric vibrators and said reference input- and output piezoelectric vibrators have an approximately square pillar-shaped body, respectively, said measurement input vibrating plate is cemented to said measurement input piezoelectric vibrator such that said measurement input vibrating plate projects like a springboard, said measurement output vibrating plate is cemented to said measurement output piezoelectric vibrator such that said measurement output vibrating plate projects like a springboard, said reference input vibrating plate is cemented to said reference input piezoelectric vibrator such that said reference input vibrating plate projects like a springboard, and said reference output vibrating plate is cemented to said reference output piezoelectric vibrator such that said reference output vibrating plate projects like a springboard.

* * * * *